US012565901B1

(12) United States Patent
Wu et al.

(10) Patent No.: US 12,565,901 B1
(45) Date of Patent: Mar. 3, 2026

(54) FAN FRAME, FAN MODULE, AND ELECTRONIC DEVICE

(71) Applicant: Wistron NeWeb Corporation, Hsinchu (TW)

(72) Inventors: Yu-Shuo Wu, Hsinchu (TW); Chia Yu Li, Hsinchu (TW); Tsung-Han Wu, Hsinchu (TW)

(73) Assignee: WISTRON NEWEB CORPORATION, Hsinchu (TW)

( * ) Notice: Subject to any disclaimer, the term of this patent is extended or adjusted under 35 U.S.C. 154(b) by 0 days.

(21) Appl. No.: 19/011,717

(22) Filed: Jan. 7, 2025

(30) Foreign Application Priority Data

Aug. 29, 2024 (TW) ................................. 113132666

(51) Int. Cl.
*F04D 29/52* (2006.01)
*F04D 29/64* (2006.01)
*H05K 7/20* (2006.01)

(52) U.S. Cl.
CPC ......... *F04D 29/522* (2013.01); *F04D 29/646* (2013.01); *H05K 7/20172* (2013.01)

(58) Field of Classification Search
CPC ...... F04D 29/522; F04D 29/60; F04D 29/601; F04D 29/64; F04D 29/644; F04D 29/646; F04D 29/668; F04D 25/0613; F04D 25/166; H05K 7/20172; H05K 7/20581; H05K 7/1401; H05K 7/16; F05D 2250/14; F05D 2250/141; F05D 2250/312; F05D 2260/30; F05D 2260/31; F05D 2260/36

See application file for complete search history.

(56) References Cited

U.S. PATENT DOCUMENTS 8,811,013 B2 * 8/2014 Tang ................... H05K 7/20727
415/214.1
11,096,314 B2 * 8/2021 Gupta ................ H05K 7/20172
11,678,467 B2 * 6/2023 Gupta .................. H05K 7/1401
361/695

(Continued)

FOREIGN PATENT DOCUMENTS

TW 201521552 A * 6/2015 ......... H05K 7/20172

OTHER PUBLICATIONS

Merriam-Webster Online Dictionary "Generally" retrieved 2025 (Year: 2025).*

*Primary Examiner* — Courtney D Heinle
*Assistant Examiner* — Ryan C Clark
(74) *Attorney, Agent, or Firm* — McClure, Qualey & Rodack, LLP

(57) ABSTRACT

A fan frame, a fan module, and an electronic device are proposed. The fan module includes a plurality of fan frames and a plurality of fan blades. The fan frames are connected to each other along a connecting direction. Each of the fan frames includes a body, a first frame and at least two positioning members. The first frame is connected to one end of the body and includes a first connecting part, at least two positioning holes and a second connecting part. The at least two positioning holes are spaced apart from each other on the first connecting part. The second connecting part is opposite to the first connecting part. The at least two positioning members are spaced apart from each other on the second connecting part. The fan blades are respectively disposed in the fan frames.

19 Claims, 8 Drawing Sheets

(56)         References Cited

U.S. PATENT DOCUMENTS

2002/0121555 A1* 9/2002 Cipolla ............ G06F 15/17381
                                            236/49.1
2003/0183588 A1* 10/2003 Steinman ............... H04Q 1/035
                                            211/26
2014/0178222 A1* 6/2014 Hou .................... F04D 25/0613
                                            417/423.15
2021/0153387 A1* 5/2021 Gupta ...................... H05K 7/16
2021/0321532 A1* 10/2021 Yang .................... F04D 29/601
2023/0171919 A1* 6/2023 Lin ....................... F04D 25/166

* cited by examiner

200

220

221
{ 2211 2212 2213 2214 }

2211
2212
2213
2214
2215

210

Z

FAN FRAME, FAN MODULE, AND ELECTRONIC DEVICE

RELATED APPLICATIONS

This application claims the benefit of priority to Taiwan Patent Application Serial No. 113132666, filed on Aug. 29, 2024. The entire content of the above identified application is incorporated herein by reference.

BACKGROUND

Technical Field

The present disclosure relates to a fan frame. More particularly, the present disclosure relates to a fan frame, a fan module, and an electronic device.

Description of Related Art

In electronic products, when a large amount of heat is concentrated inside the product, it can lead to reduced lifespan of electronic components or even cause them to burn out. Fans are one of the fast and effective solutions to solve the internal heat dissipation problem of products, and they have been widely used in electronic products. The configuration of fans often involves multiple fans arranged side by side inside the electronic product.

The method of fixing multiple fans inside the product includes directly attaching the fans to the casing or fixing the fans with additional fan brackets. Although the former is the most cost-effective solution, it is not aesthetically pleasing and causes noise and resonance issues due to the fans being close to the casing. The latter can solve aesthetic, noise, and resonance issues, but requires corresponding brackets for different numbers of fans as well as different distances between the fans, and the space reserved for screws to attach the brackets affects the depth design of the product, making it less cost-effective and unfriendly for storage management.

In view of this, a fan module that is aesthetically pleasing, does not require additional fixing brackets, and allows for free splicing and distance adjustment is a common goal for related industries.

SUMMARY

According to one aspect of the present disclosure, a fan frame includes a body, a first frame, and at least two positioning members. The body has a receiving space. The first frame is connected to one end of the body and includes a first connecting part, at least two positioning holes, and a second connecting part. The at least two positioning holes are spaced apart from each other and disposed on the first connecting part. The second connecting part is opposite to the first connecting part, and there is a first distance between the first connecting part and the second connecting part along a direction. The at least two positioning members are spaced apart from each other and disposed on the second connecting part, and the at least two positioning members protrude in the direction.

According another aspect of the present disclosure, a fan module includes a plurality of fan frames and a plurality of fan blades. The plurality of fan frames are connected to each other along a connecting direction, and each of the plurality of fan frames includes a body, a first frame, and at least two positioning members. The body has a receiving space. The first frame is connected to one end of the body and includes a first connecting part, at least two positioning holes, and a second connecting part. The at least two positioning holes are spaced apart from each other and disposed on the first connecting part. The second connecting part is opposite to the first connecting part. The at least two positioning members are spaced apart from each other and disposed on the second connecting part. The plurality of fan blades are respectively disposed in the receiving space of the plurality of fan frames. A distance between adjacent two of the plurality of fan frames is adjustable through the at least two positioning holes and the at least two positioning members.

According to yet another aspect of the present disclosure, an electronic device includes a housing and a fan module. The fan module is disposed in the housing and includes a plurality of fan frames and a plurality of fan blades. The plurality of fan frames are connected to each other along a connecting direction, and each of the plurality of fan frames includes a body, a first frame, at least two positioning members, and a second frame. The body has a receiving space. The first frame is connected to one end of the body and includes a first connecting part, at least two positioning holes, and a second connecting part. The at least two positioning holes are spaced apart from each other and disposed on the first connecting part. The second connecting part is opposite to the first connecting part, and there is a first distance between the first connecting part and the second connecting part along a direction. The at least two positioning members are spaced apart from each other and disposed on the second connecting part. The at least two positioning members protrude in the direction, and the direction is perpendicular to the connecting direction. The second frame is connected to another end of the body. The plurality of fan blades are respectively disposed in the receiving space of each of the plurality of fan frames.

BRIEF DESCRIPTION OF THE DRAWINGS

The present disclosure can be more fully understood by reading the following detailed description of the embodiment, with reference made to the accompanying drawings as follows.

DETAILED DESCRIPTION

Figure 1:
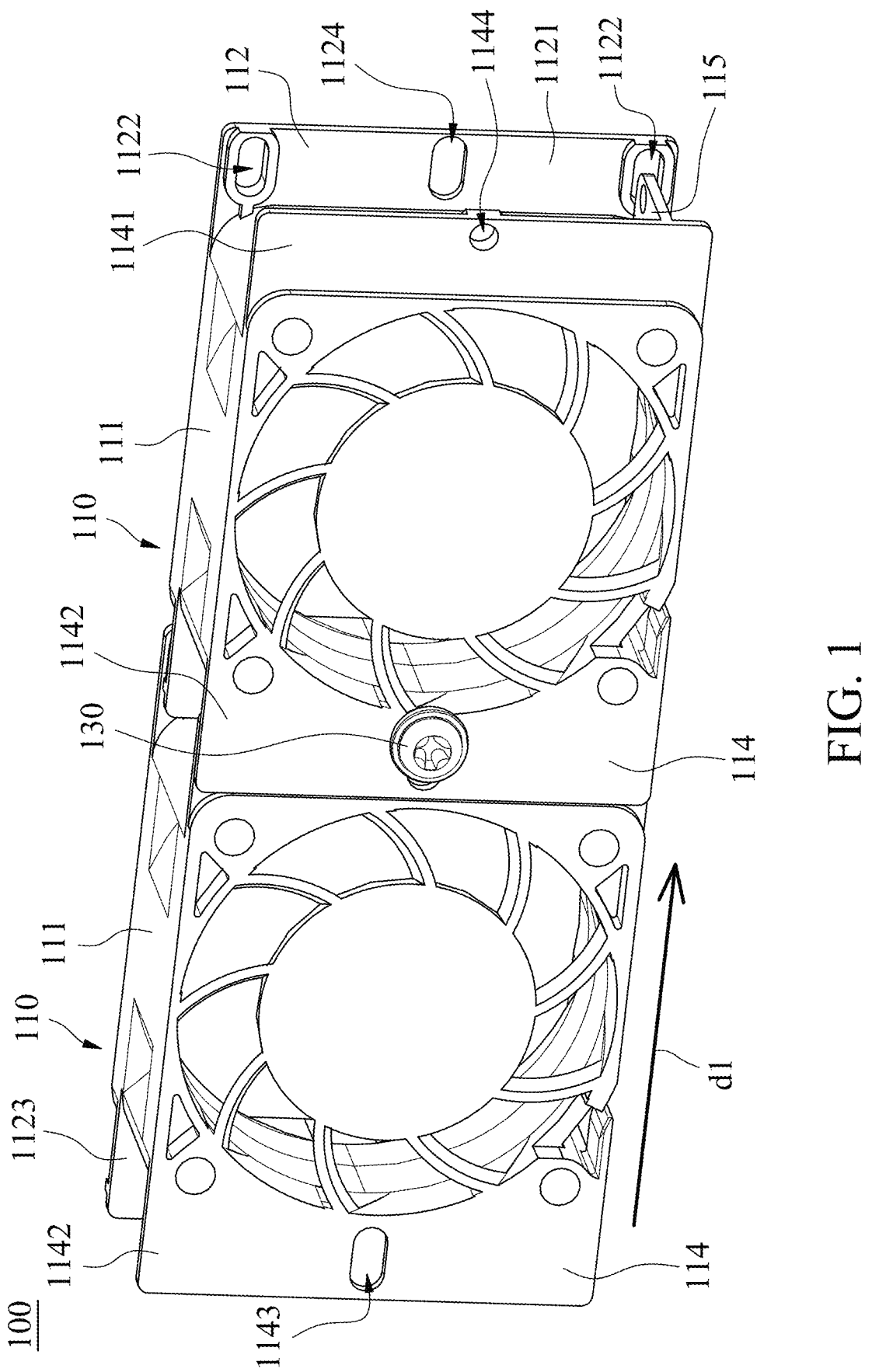
FIG. 1 is a schematic diagram of a fan module according to a first embodiment of the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

Figure 2:
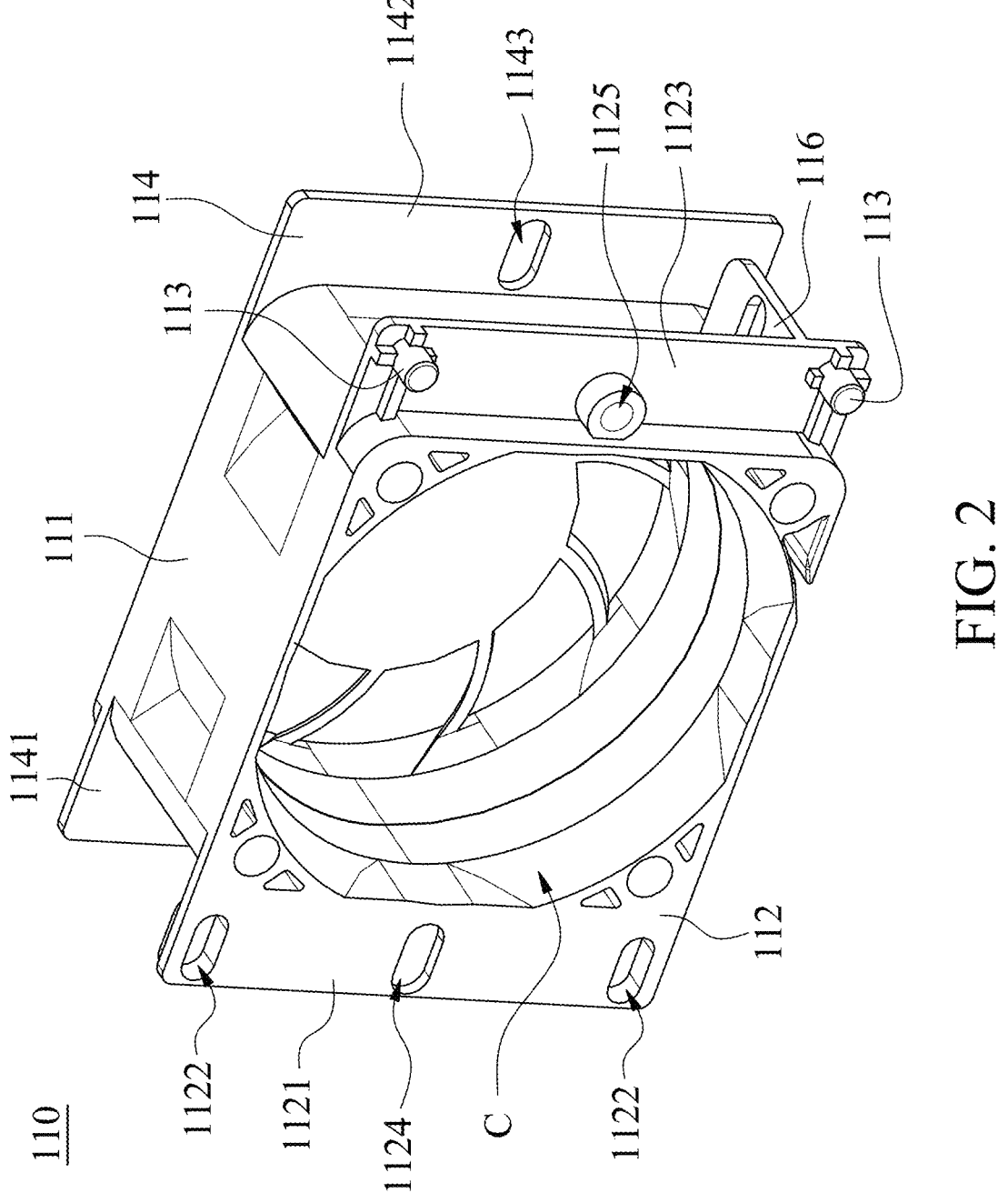
FIG. 2 is a schematic diagram of a fan frame of FIG. 1.
Figure 3:
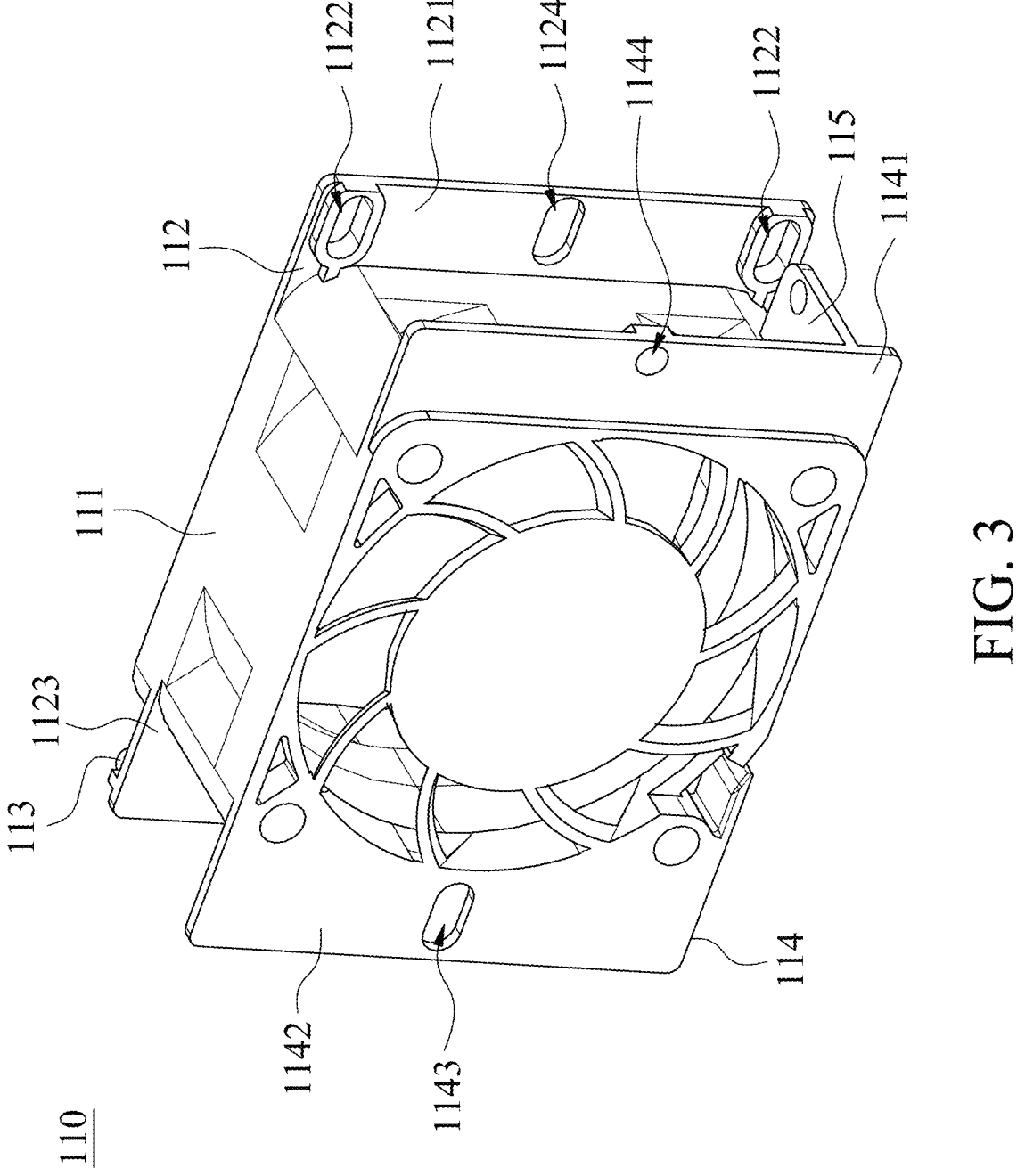
FIG. 3 is another schematic diagram of the fan frame of FIG. 1.

Referring to FIG. 1, FIG. 2, and FIG. 3. FIG. 1 is a schematic diagram of a fan module 100 according to a first embodiment of the present disclosure; FIG. 2 is a schematic diagram of a fan frame 110 of FIG. 1; and FIG. 3 is another schematic diagram of the fan frame 110 of FIG. 1. The fan module 100 includes a plurality of fan frames 110, a plurality of fan blades (not shown), and at least one coupling member 130. The coupling member 130 is used to connect the fan frames 110, and the fan blades are respectively arranged in the fan frames 110. It should be particularly noted that there is no limit on the number of fan frames 110 in the splicing application, and it can be extended infinitely. In the first embodiment, the number of fan frames 110 is two, the number of fan blades is two, and the number of coupling members 130 is one, but the present disclosure is not limited thereto. In the first embodiment, the coupling member 130 can be a screw, but the present disclosure is not limited thereto.

The fan frames 110 are connected to each other along a connecting direction d1, and each of the fan frames 110 includes a body 111, a first frame 112, and at least two positioning members 113. The first frame 112 is connected to one end of the body 111, and the positioning members 113 are arranged on the first frame 112.

The body 111 has a receiving space C, and the fan blades are arranged in the receiving space C. The first frame 112 includes a first connecting part 1121, at least two positioning holes 1122, and a second connecting part 1123. The second connecting part 1123 is opposite to the first connecting part 1121, the at least two positioning holes 1122 are spaced apart from each other and disposed on the first connecting part 1121, and the at least two positioning members 113 are spaced apart from each other and disposed on the second connecting part 1123. The number and position of the at least two positioning members 113 correspond to the at least two positioning holes 1122. In the first embodiment, the number of the at least two positioning holes 1122 is two, and the number of the at least two positioning members 113 is two, but the present disclosure is not limited thereto.

Figure 4:
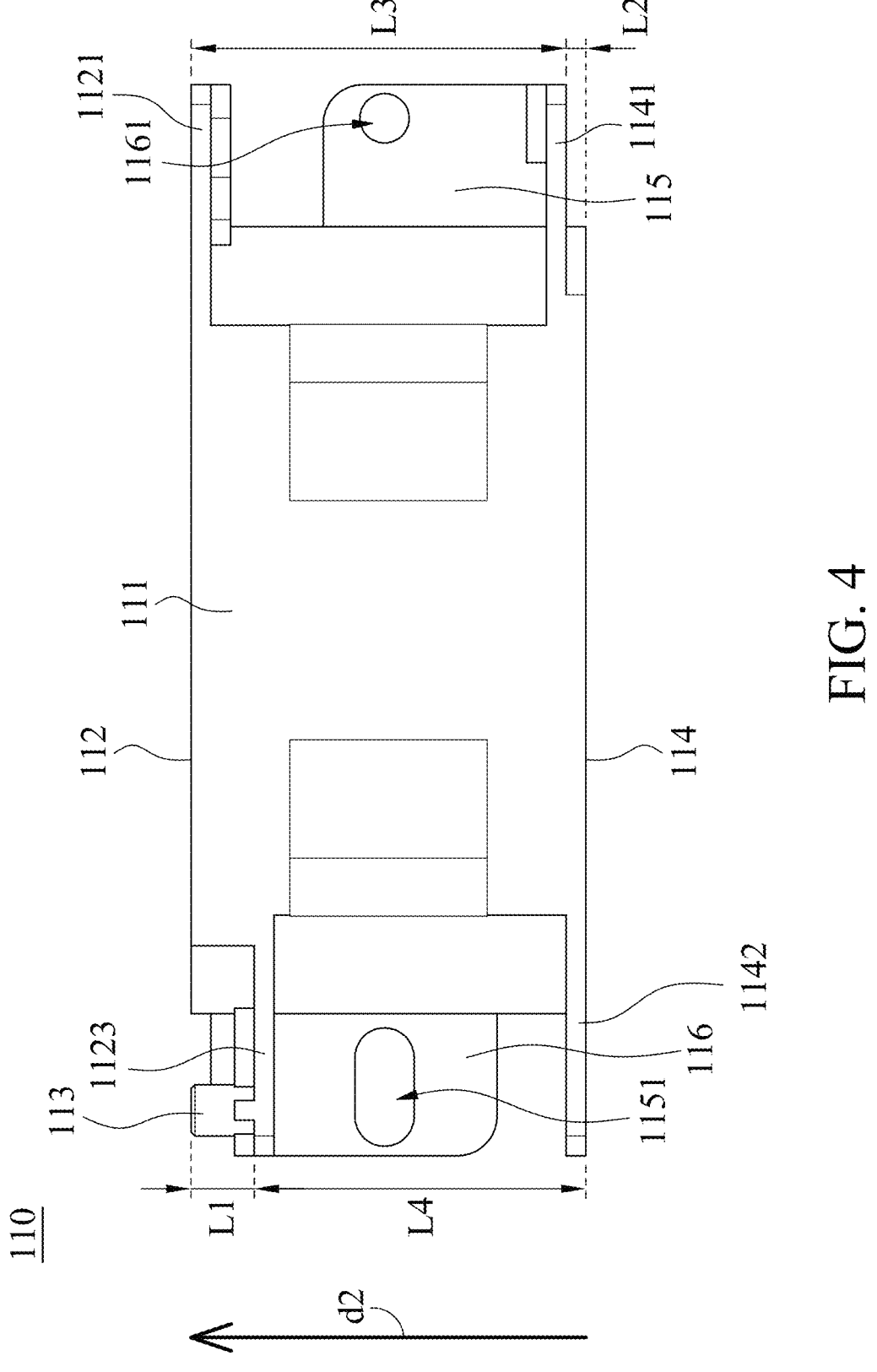
FIG. 4 is a top view of the fan frame of FIG. 3.

Referring to FIG. 2, FIG. 3, and FIG. 4. FIG. 4 is a top view of the fan frame 110 of FIG. 3. There is a first distance L1 between the first connecting part 1121 and the second connecting part 1123 along a direction d2, and the positioning members 113 protrude in the direction d2 and are coplanar with the first connecting part 1121. The direction d2 is perpendicular to the connecting direction d1.

The fan frames 110 can further include a second frame 114. The second frame 114 is connected to another end of the body 111 and includes a first assembling part 1141 and a second assembling part 1142. The second assembling part 1142 is opposite to the first assembling part 1141. There is a second distance L2 between the first assembling part 1141 and the second assembling part 1142 along the direction d2, and the first distance L1 is greater than the second distance L2.

In addition, there is a third distance L3 between the first connecting part 1121 and the first assembling part 1141 along the direction d2. There is a fourth distance L4 between the second connecting part 1123 and the second assembling part 1142 along the direction d2. The third distance L3 is greater than the fourth distance L4.

Figures 5A, 5B:
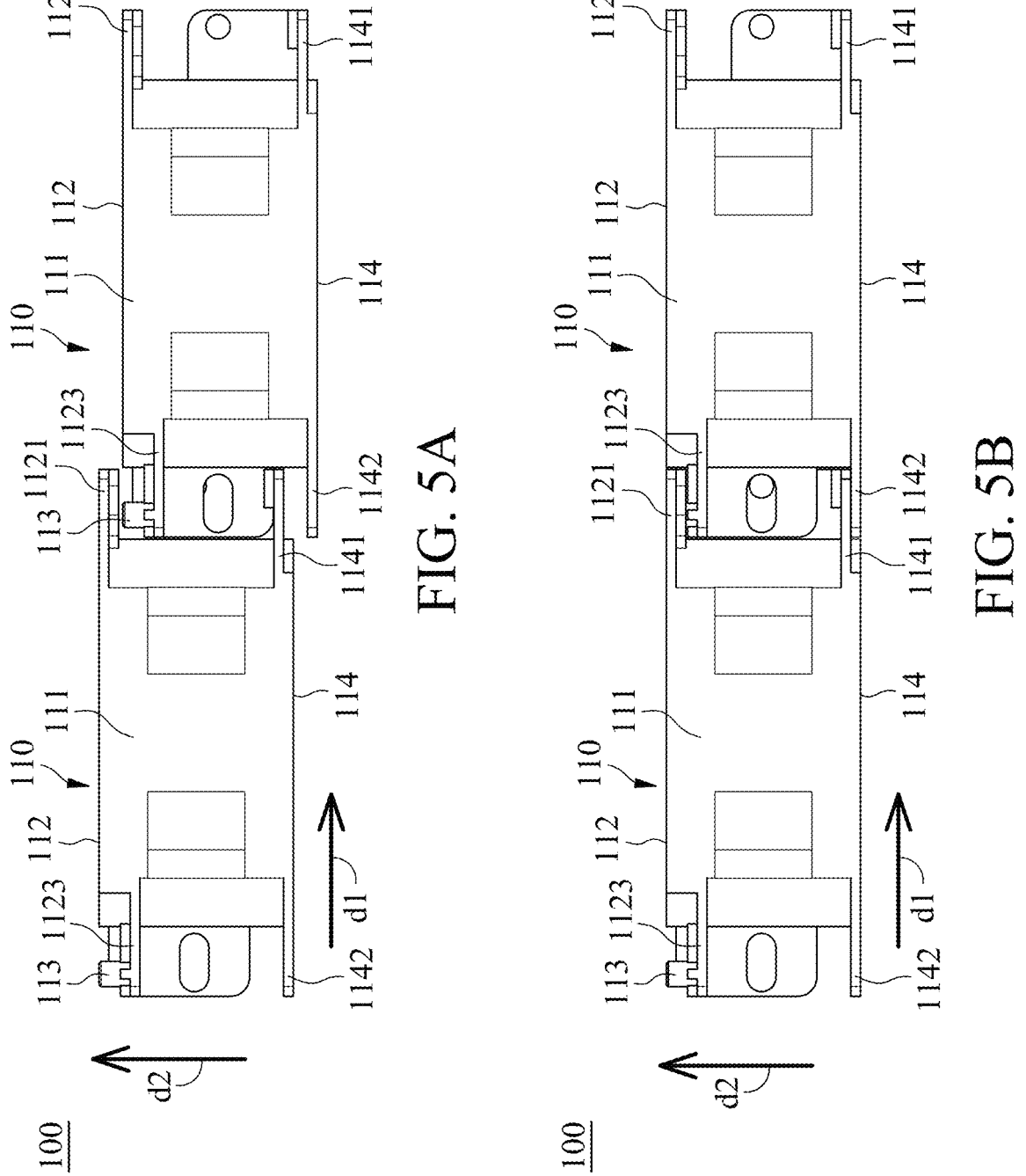
FIG. 5A is a schematic diagram of the fan frames of FIG. 1 being assembled.
FIG. 5B is another schematic diagram of the fan frames of FIG. 1 being assembled.

Referring to FIG. 1, FIG. 2, FIG. 4, FIG. 5A, and FIG. 5B. FIG. 5A is a schematic diagram of the fan frames 110 of FIG. 1 being assembled; and FIG. 5B is another schematic diagram of the fan frames 110 of FIG. 1 being assembled. Adjacent fan frames 110 are connected to each other through the coupling member 130 and are assembled and aligned through the positioning holes 1122 and the positioning members 113.

Specifically, as shown in FIG. 5A, the two positioning holes 1122 (shown in FIG. 2) of one of the adjacent fan frames 110 are used for the two positioning members 113 of the other one of the adjacent fan frames 110 to insert along the direction d2. As shown in FIG. 5B, one of the adjacent fan frames 110 is positioned on one side of the other one of the adjacent fan frames 110 along the connecting direction d1. The first connecting part 1121 of one of the adjacent fan frames 110 is connected to the second connecting part 1123 of the other one of the adjacent fan frames 110, and the first assembling part 1141 of one of the adjacent fan frames 110 is connected to the second assembling part 1142 of the other one of the adjacent fan frames 110.

Therefore, through the positioning holes 1122 and the positioning members 113, the adjacent fan frames 110 can be accurately aligned, and through the coupling member 130, the fan frames 110 can be connected. As such, the fan frames 110 can be freely spliced.

Figure 6:
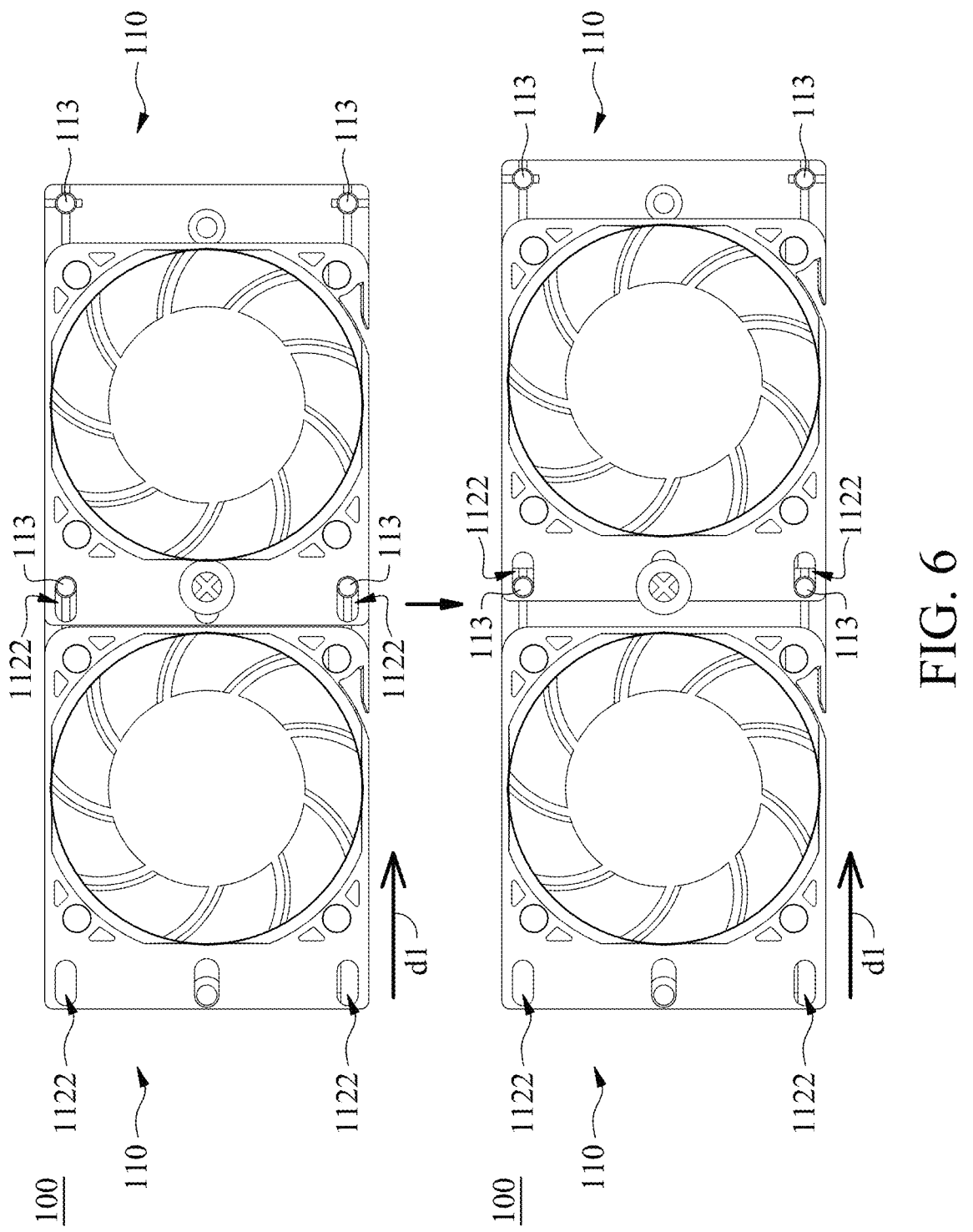
FIG. 6 is a schematic diagram showing distance adjustment between the fan frames of FIG. 1.

Referring to FIG. 1, FIG. 4, and FIG. 6. FIG. 6 is a schematic diagram showing distance adjustment between the fan frames 110 of FIG. 1. The distance between the adjacent fan frames 110 can also be adjusted through the positioning holes 1122 and the positioning members 113.

Specifically, the positioning holes 1122 are generally elliptical and extend along the connecting direction d1, so that the positioning members 113 of one of the adjacent fan frames 110 can move along the connecting direction d1 in the positioning holes 1122 of the other one of the adjacent fan frames 110, thereby changing the distance between the two fan frames 110.

Therefore, the distance between the adjacent fan frames 110 can be freely adjusted, making the configuration and installation inside the electronic product more flexible.

As shown in FIG. 1, FIG. 2, and FIG. 3, the first frame 112 can further include a lock hole 1124 and a screw hole 1125. The lock hole 1124 is arranged on the first connecting part 1121, and the screw hole 1125 is arranged on the second connecting part 1123 (as shown in FIG. 2). The second frame 114 can further include a lock hole 1143 and a screw hole 1144. The lock hole 1143 is arranged on the second assembling part 1142, and the screw hole 1144 is arranged on the first assembling part 1141 (as shown in FIG. 3). The coupling member 130 can connect the adjacent fan frames 110 through the lock hole 1124 and the screw hole 1125 or the lock hole 1143 and the screw hole 1144.

As shown in FIG. 4, the fan frames 110 can further include a first side plate 115 and a second side plate 116. The first side plate 115 is connected to the body 111 and the second frame 114, and the second side plate 116 is connected to the body 111 and the first frame 112. The first side plate 115 includes a screw hole 1161, and the second side plate 116 includes a lock hole 1151. The fan module 100 can be fixed inside the electronic product through the screw hole 1161 and the lock hole 1151.

Figure 7:
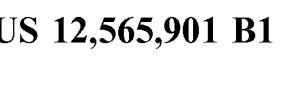
FIG. 7 is a schematic diagram of an electronic device according to a second embodiment of the present disclosure.

Referring to FIG. 7. FIG. 7 is a schematic diagram of an electronic device 200 according to a second embodiment of the present disclosure. The electronic device 200 includes a housing 210 and a fan module 220. The fan module 220 is arranged in the housing 210. The fan module 220 includes a plurality of fan frames 221 and a plurality of fan blades (not shown), and the fan blades are respectively arranged in the fan frames 221. The fan frames 221 are connected to each other along a connecting direction d1 (not shown) and include a body 2211, a first frame 2212, at least two positioning members 2213, a second frame 2214, and two side plates 2215. The fan frames 221 can be fixed to the housing 210 through screws (not separately labeled) and the first frame 2212, the second frame 2214, or one of the two side plates 2215. It should be particularly noted that the number and position of the screws can be configured considering resonance. In the second embodiment, the fan frame 221 is fixed to the housing 210 of the electronic device 200 along a Z-axis direction Z through the first frame 2212 and screws (not separately labeled).

In addition, in the second embodiment, the body 2211, the first frame 2212, the at least two positioning members 2213, the second frame 2214, the two side plates 2215 of each of the fan frames 221, and the fan blades are the same or similar to the body 111, the first frame 112, the at least two positioning members 113, the second frame 114, the first side plate 115, the second side plate 116 of each of the fan frames 110 and the fan blades of the first embodiment, and will not be further described here.

Figure 8:
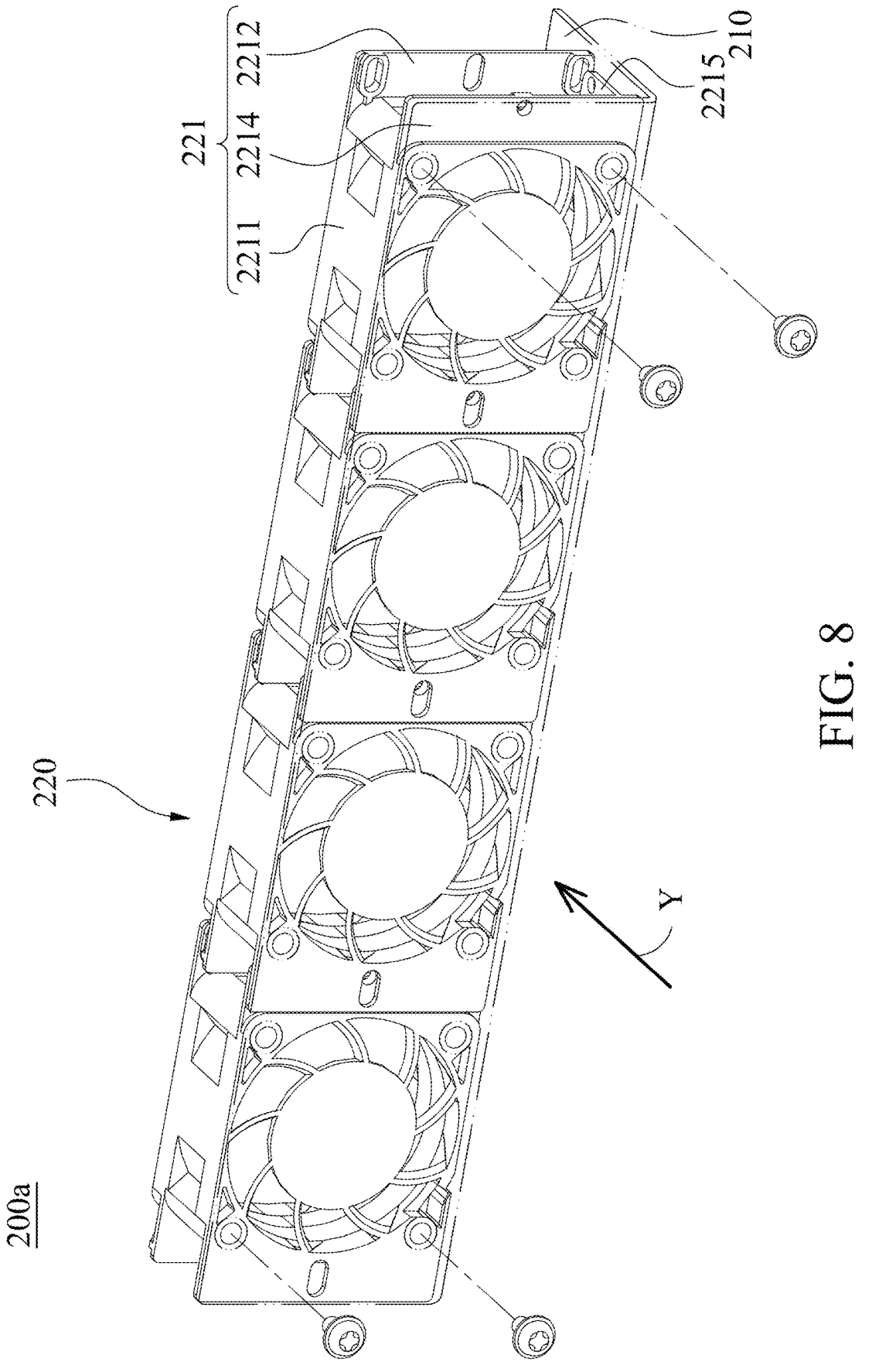
FIG. 8 is a schematic diagram of an electronic device according to a third embodiment of the present disclosure.

Referring to FIG. 8. FIG. 8 is a schematic diagram of an electronic device 200a according to a third embodiment of the present disclosure. In the third embodiment, the difference from the electronic device 200 of the second embodiment is that the fan frames 221 is fixed to the housing 210 of the electronic device 200 along a Y-axis direction Y through the two side plates 2215 and screws (not separately labeled).

Therefore, in addition to being more aesthetically pleasing in installation, the fan module 220 can also be fixed at any position inside the product for heat dissipation considerations, making it more efficient in use.

From the above embodiments, it can be seen that the present disclosure has the following advantages: First, through the positioning holes and positioning members of the fan frame, the adjacent fan frames can be accurately aligned, and through the coupling member, and adjacent fan frames can be connected and combined, achieving the purpose of freely splicing the fan frames, and achieving the purpose of being aesthetically pleasing without additional fixing brackets. Second, through the positioning holes and positioning members of the fan frame, the distance between the adjacent fan frames can be freely adjusted, making the configuration and installation inside the electronic product more flexible.

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A fan frame, comprising:
a body, having a receiving space;
a first frame, connected to one end of the body, and comprising:
a first connecting part;
at least two positioning holes, spaced apart from each other and disposed on the first connecting part; and
a second connecting part, opposite to the first connecting part, wherein there is a first distance between the first connecting part and the second connecting part along a direction;
a second frame, connected to another end of the body, and comprising:
a first assembling part; and
a second assembling part, opposite to the first assembling part, wherein there is a second distance between the first assembling part and the second assembling part along the direction; and
at least two positioning members, spaced apart from each other and disposed on the second connecting part, and the at least two positioning members protruding in the direction.

2. The fan frame of claim 1, wherein the first distance is greater than the second distance.

3. The fan frame of claim 1, wherein there is a third distance between the first connecting part and the first assembling part along the direction, and there is a fourth distance between the second connecting part and the second assembling part along the direction.

4. The fan frame of claim 3, wherein the third distance is greater than the fourth distance.

5. The fan frame of claim 1, wherein the second frame further comprises:
a lock hole, disposed on the second assembling part; and
a screw hole, disposed on the first assembling part.

6. The fan frame of claim 1, wherein the first frame further comprises:
a lock hole, disposed on the first connecting part; and
a screw hole, disposed on the second connecting part.

7. The fan frame of claim 1, further comprising:
a first side plate, connected to the body and the second frame; and
a second side plate, connected to the body and the first frame.

8. The fan frame of claim 7, wherein the first side plate comprises a screw hole, and the second side plate comprises a lock hole.

9. The fan frame of claim 1, wherein the at least two positioning holes are elliptical.

10. A fan module, comprising:
a plurality of fan frames, connected to each other along a connecting direction, each of the plurality of fan frames comprising:
a body, having a receiving space;

a first frame, connected to one end of the body, and comprising:

a first connecting part;

at least two positioning holes, spaced apart from each other and disposed on the first connecting part; and a second connecting part, opposite to the first connecting part;

a second frame, connected to another end of the body, and comprising:

a first assembling part; and a second assembling part, opposite to the first assembling part, wherein there is a second distance between the first assembling part and the second assembling part along the direction; and at least two positioning members, spaced apart from each other and disposed on the second connecting part; and a plurality of fan blades, respectively disposed in the receiving space of each of the plurality of fan frames;

wherein a distance between adjacent two of the plurality of fan frames is adjustable through the at least two positioning holes and the at least two positioning members.

11. The fan module of claim 10, wherein there is a first distance between the first connecting part and the second connecting part along a direction, the at least two positioning members protrude in the direction, and the direction is perpendicular to the connecting direction.

12. The fan module of claim 11, wherein the at least two positioning holes of one of the plurality of fan frames are used for the at least two positioning members of an adjacent one of the plurality of fan frames to be inserted along the direction, so the adjacent one of the plurality of fan frames is positioned on one side of the one of the plurality of fan frames along the connecting direction.

13. The fan module of claim 10, wherein the first connecting part of one of the plurality of fan frames is connected to the second connecting part of an adjacent one of the plurality of fan frames.

14. The fan module of claim 11, wherein the first distance is greater than the second distance.

15. The fan module of claim 10, wherein the first assembling part of one of the plurality of fan frames is connected to the second assembling part of an adjacent one of the plurality of fan frames.

16. The fan module of claim 10, wherein the at least two positioning holes are elliptical and extend along the connecting direction.

17. The fan module of claim 10, further comprising:

at least one coupling member, for connecting the plurality of fan frames.

18. An electronic device, comprising:

a housing; and a fan module, disposed in the housing, and comprising:

a plurality of fan frames, connected to each other along a connecting direction, and each of the plurality of fan frames comprising:

a body, having a receiving space;

a first frame, connected to one end of the body, and comprising:

a first connecting part;

at least two positioning holes, spaced apart from each other and disposed on the first connecting part; and a second connecting part, opposite to the first connecting part, wherein there is a first distance between the first connecting part and the second connecting part along a direction; and at least two positioning members, spaced apart from each other and disposed on the second connecting part, wherein the at least two positioning members protrude in the direction, and the direction is perpendicular to the connecting direction; and a second frame, connected to another end of the body, and comprising:

a first assembling part; and a second assembling part, opposite to the first assembling part, wherein there is a second distance between the first assembling part and the second assembling part along the direction; and a plurality of fan blades, respectively disposed in the receiving space of each of the plurality of fan frames;

wherein a distance between adjacent two of the plurality of fan frames is adjustable through the at least two positioning holes and the at least two positioning members.

19. The electronic device of claim 18, further comprising:

two side plates, respectively connected to the body;

wherein the fan module is fixed to the housing through the first frame, the second frame, or one of the two side plates.

* * * * *